US006297550B1

(12) United States Patent
Chia et al.

(10) Patent No.: US 6,297,550 B1
(45) Date of Patent: Oct. 2, 2001

(54) BONDABLE ANODIZED ALUMINUM HEATSPREADER FOR SEMICONDUCTOR PACKAGES

(75) Inventors: Chok J. Chia, Campbell; Patrick Variot, San Jose; Maniam Alagaratnam, Cupertino, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/053,357

(22) Filed: Apr. 1, 1998

(51) Int. Cl.[7] ................................................. H01L 23/34
(52) U.S. Cl. .................. 257/707; 257/712; 257/717; 257/720; 361/704; 361/709; 361/711; 174/252
(58) Field of Search .................................. 257/704, 706, 257/707, 675, 712, 713, 717, 720; 361/704, 705, 707, 709, 711, 713; 174/252

(56) References Cited

U.S. PATENT DOCUMENTS

| 3,469,017 | * | 9/1969 | Starger ..................................... 174/52 |
| 4,012,768 | * | 3/1977 | Kirk et al. ............................. 257/793 |
| 4,092,697 | * | 5/1978 | Spaight ................................. 361/386 |
| 5,003,429 |   | 3/1991 | Baker et al. ........................... 361/386 |
| 5,013,871 | * | 5/1991 | Mahulikar et al. .................... 174/52.4 |
| 5,225,710 |   | 7/1993 | Westerkamp ........................... 257/713 |
| 5,289,337 |   | 2/1994 | Aghazadeh et al. ................... 361/718 |
| 5,367,196 | * | 11/1994 | Mahulikar et al. .................... 257/787 |
| 5,402,006 | * | 3/1995 | O'Donley ............................... 257/796 |
| 5,578,869 | * | 11/1996 | Hoffman et al. ....................... 257/691 |
| 5,583,377 |   | 12/1996 | Higgins ................................. 257/707 |
| 5,596,231 | * | 1/1997 | Combs .................................. 257/776 |
| 5,621,616 |   | 4/1997 | Owens et al. ........................ 361/704 |
| 5,629,835 | * | 5/1997 | Mahulikar et al. .................... 361/179 |
| 5,650,663 | * | 7/1997 | Parthasarathi ......................... 257/706 |
| 5,701,034 | * | 12/1997 | Marrs .................................... 257/706 |
| 5,744,863 | * | 4/1998 | Culnane et al. ....................... 257/712 |
| 5,796,038 | * | 8/1998 | Manteghi ............................. 174/52.4 |
| 5,796,170 | * | 8/1998 | Marcantonio ......................... 257/786 |
| 5,808,870 | * | 9/1998 | Chiu ..................................... 361/705 |
| 5,866,943 | * | 2/1999 | Mertol .................................. 257/712 |
| 5,895,966 | * | 4/1999 | Penchuk ............................... 257/690 |
| 5,909,056 | * | 6/1999 | Mertol .................................. 257/704 |
| 5,948,542 | * | 9/1999 | Le et al. ............................. 428/472.2 |
| 6,111,311 | * | 8/2000 | Suzuki ................................. 257/691 |

FOREIGN PATENT DOCUMENTS 3-218656 * 9/1991 (JP) .

* cited by examiner

Primary Examiner—Olik Chaudhuri
Assistant Examiner—Alonzo Chambliss

(57) ABSTRACT

A semiconductor package (100) includes a bondable aluminum heatspreader (130) made from anodized aluminum, thereby forming an anodization layer (132) on the surface of the heatspreader. Portions of the anodization layer are removed, e.g., by grinding, in order to provide an attachment area (124) to which a wire (122) or beam may be bonded in order to electrically connect the heatspreader to a desired voltage potential, such as a ground potential or a positive or negative potential. The heatspreader is thermally bonded to a semiconductor die (102) housed within the package. The anodized aluminum heatspreader thus not only removes and dissipates heat from the semiconductor die, but also functions as a voltage or ground plane within the semiconductor package.

15 Claims, 2 Drawing Sheets

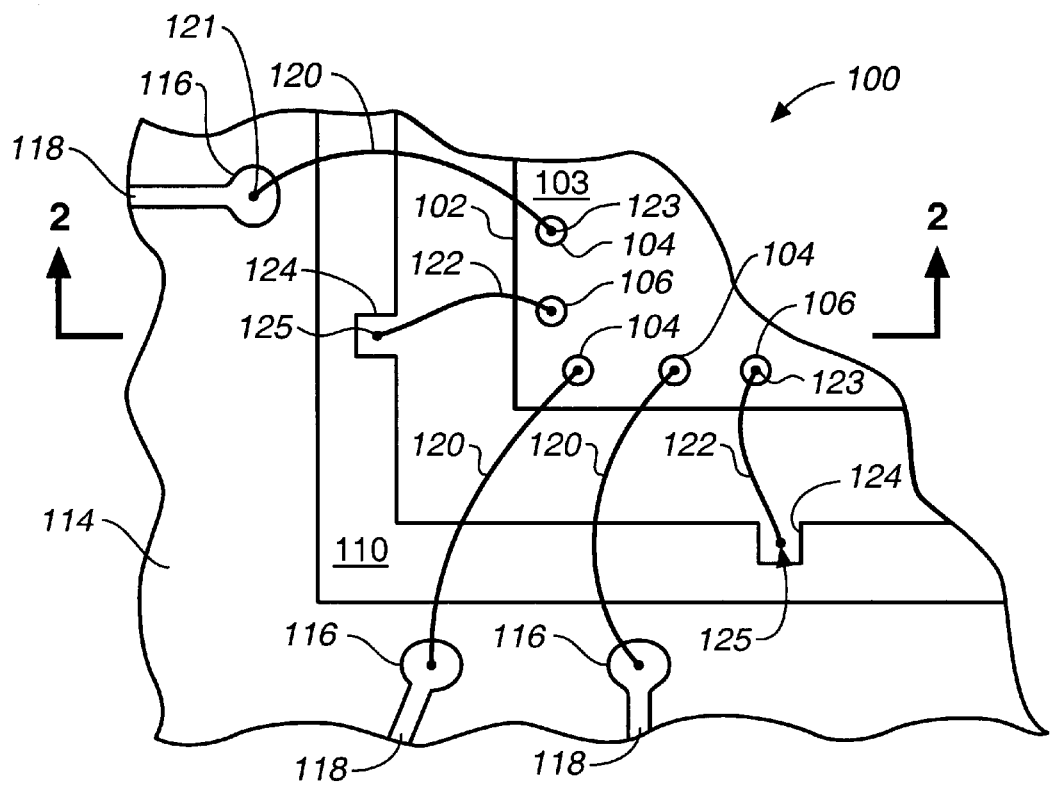
FIG._1
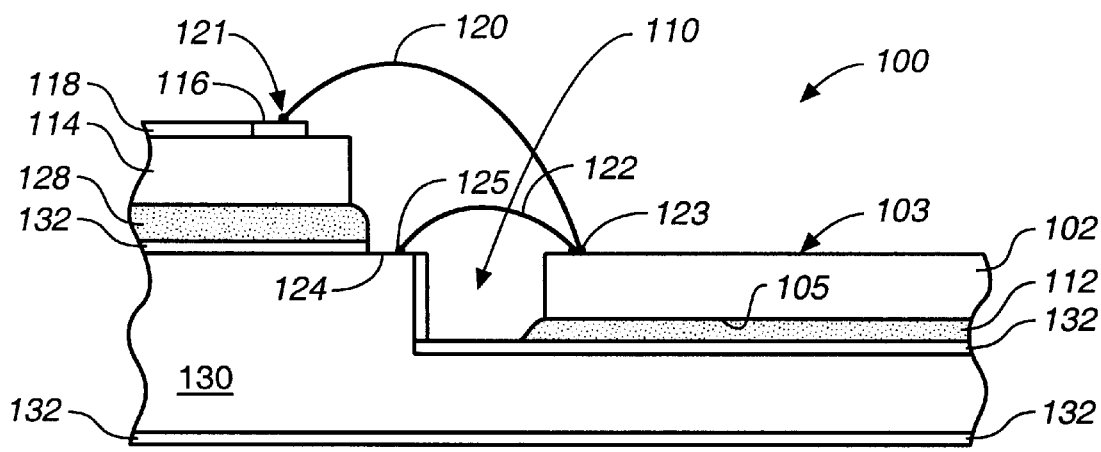
FIG._2

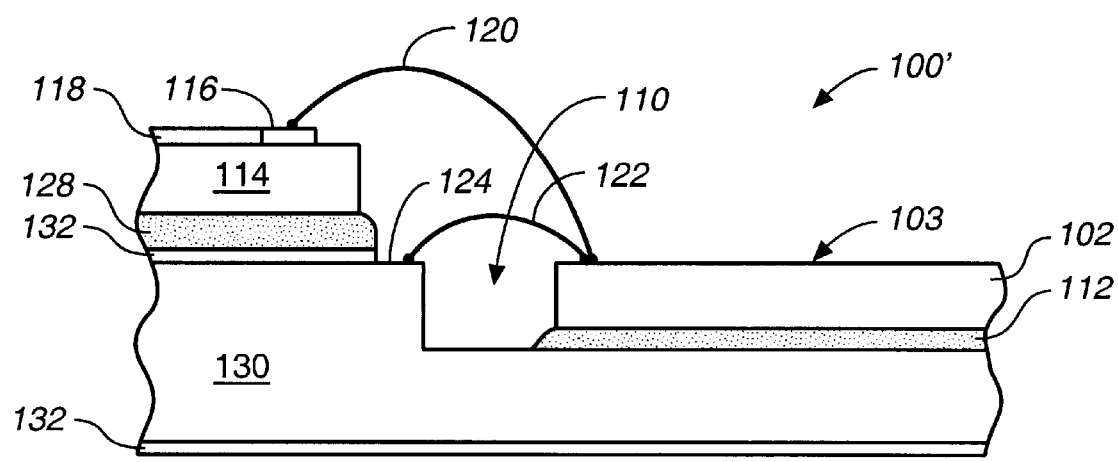
FIG._3
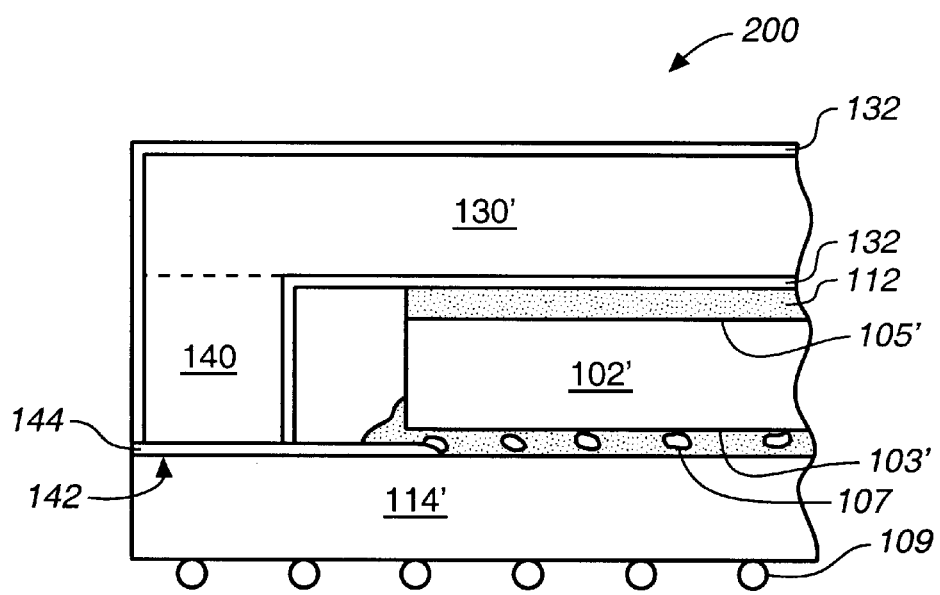
FIG._4

BONDABLE ANODIZED ALUMINUM HEATSPREADER FOR SEMICONDUCTOR PACKAGES

BACKGROUND OF THE INVENTION

The present invention relates to a semiconductor package and method of packaging a semiconductor die, e.g., an integrated circuit, and more particularly to a semiconductor package wherein an anodized aluminum heatspreader is used to serve the dual purpose of heat dissipation and a ground or voltage plane.

In the last few decades, the electronics industry has literally transformed the world. Electronic products are used by, or affect the daily lives of, a large segment of the world's population. For example, telephones, television, radios, Personal Computers (PCS), laptop PCS, palmtop PCS, PCS with built-in portable phones, cellular phones, wireless phones, pagers, modems, and video camcorders, are just a few of the electronic products that have been developed in recent years and which have been made smaller and more compact, while providing more and/or enhanced functions than ever before. The integrated circuit (IC) chip, and the more efficient packaging of the IC chip, have played a key role in the success of these products.

The IC chip, sometimes referred to as the IC "die", contains embedded electronic circuitry that performs, at least in part, the electrical/electronic functions for the particular electronic device wherein the IC chip is used. The IC chip, however, is not an isolated island. It must communicate with other chips in a circuit through an Input/Output (I/O) system of electrical interconnections, or "interconnects". Moreover, the IC chip and its embedded circuitry are delicate, and must therefore be protected in a package that can both carry and protect it. As a result, the major functions of the IC package are: (1) to provide a path for the electrical current that powers the circuits on the chip; (2) to distribute the signals on to and off of the chip; (3) to remove the heat generated by the circuit; and (4) to support and protect the chip from hostile environments.

Integrated circuits are typically housed within a package that is mounted to a printed circuit board (PCB) or printed wiring board (PWB). As part of an IC package wherein a high performance IC die is housed, a heatspreader may be used. A heatspreader typically comprises a planar thermally-conductive element, such as a sheet of metal, that is located so as to have good thermal contact with the IC die. Heat generated in the IC die by operation of the circuits embedded therein is thus conducted to the heatspreader, where it is dissipated, thereby helping maintain the junction temperatures of the semiconductor devices included within the circuits of the IC die at safe operating levels.

It is also possible to use a heatspreader as a power or ground plane. Should the heatspreader double as a power or ground plane, however, it must be bondable, i.e., it must be electrically connected to the power or ground bond pads on the chip (die). Such electrical connection could be done with wire bonds, or (in the case of Tape Automated Bonding (TAB)) with beam bonds.

Examples of semiconductor packages that incorporate heatspreaders include Plastic Ball Grid Array (PBGA) packages, Tape Ball Grid Array (TBGA) packages, Plastic Pin Grid Array (PPGA) packages, and Plastic Quad Flat Packs (PQFP). In such packages, when a heatspreader is used, it is typically made of copper, with nickel and gold plating. The plating is required to prevent the copper from discoloring. Also, if electrical connection is made to the heatspreader, i.e., if the heatspreader is also used as a voltage or ground plane, then the plating is required to provide a stable surface for bonding a wire or beam thereto.

Disadvantageously, using copper as a heatspreader adds significant weight to the semiconductor package. Moreover, plating of the copper heatspreader adds substantial expense and cost to the total semiconductor package. Additionally, when used as a power or ground plane, the entire gold- or nickel-plated heatspreader is conductive, and care must thus be exercised to prevent inadvertent electrical shorting to the heatspreader. As a practical matter, this typically limits the heatspreader's use to a ground plane (zero voltage) because a heatspreader that also represents a "live" power voltage (non-zero voltage) is not generally acceptable for most users.

It is thus apparent that improvements are needed in the types of heatspreaders used within a semiconductor package. In particular, it is apparent that improvements are needed to reduce the cost and expense of making a heatspreader, to reduce its weight, to facilitate making electrical connections therewith (i.e., bonding wires or beams thereto), and to more readily make the heatspreader usable as a voltage plane (not just a ground plane).

SUMMARY OF THE INVENTION

The present invention addresses the above and other needs by providing a semiconductor package, e.g., a PBGA, TBGA, PPGA, or PQFP package, wherein the heatspreader is fabricated from aluminum or aluminum alloys. For cosmetic and adhesion purposes, the aluminum heatspreader is anodized. Sections of the aluminum surface are ground off to expose non-anodized areas that serve as bond areas for making electrical connection. Gold wires, aluminum wires, gold plated beams, or other electrical conductors may then be bonded to the exposed bond areas (non-anodized areas), thereby effectively using the heatspreader as a power or ground plane within the semiconductor package in order to improve the electrical performance of the package.

In accordance with one aspect of the invention a semiconductor package is provided that includes: (a) a substrate; (b) a semiconductor die electrically connected to the substrate; and (c) a heatspreader thermally bonded to the semiconductor die, the heatspreader being made from anodized aluminum.

In accordance with another aspect of the invention, a bondable aluminum heatspreader is provided for use within a semiconductor package wherein a semiconductor die is housed. The semiconductor die is thermally bonded to and electrically connected to the heatspreader. The bondable aluminum heatspreader is made from a piece (e.g., a sheet) of aluminum or an aluminum alloy that has been anodized so as to form a protective, insulative, aluminum oxide coating thereon.

In accordance with yet another aspect of the invention, there is provided a method of making a semiconductor package having a bondable aluminum heatspreader therein. Such method includes the steps of: (a) forming a package substrate having electrical input/output (I/O) means therein; (b) forming a heatspreader from a piece of aluminum; (c) anodizing the aluminum heatspreader to form a coating of aluminum oxide thereon; (d) grinding away a small area of the aluminum oxide layer to expose the piece of aluminum thereunder, thereby creating a connection area on the exposed surface of the aluminum; (e) attaching the anodized aluminum heatspreader to the package substrate; (f) thermally bonding a non-active surface of a semiconductor die to the heatspreader, an active surface of the semiconductor die thereby facing away from the heatspreader, and wherein the active surface of the semiconductor die has a plurality of contact pads thereon through which electrical connection may be established with the semiconductor die; (g) electrically connecting at least one of the contact pads on the active surface of the semiconductor die to the connection area on the exposed surface of the aluminum heatspreader; and (h) electrically connecting others of the contact pads on the active surface of the semiconductor die to the I/O means included within the package substrate.

It is feature of the invention to reduce the cost and expense associated with making a heatspreader.

It is another feature of the invention to provide a heatspreader for use within a semiconductor package that is light weight and which can be colored to a desired color for cosmetic or other purposes, e.g., to improve its heat dissipation properties.

It is yet a further feature of the invention to provide an electrically-insulated heatspreader having bondable contact areas to which electrical connection is readily made, e.g., to which bonding wires or beams may be connected, thereby allowing the heatspreader to be used as a voltage plane.

BRIEF DESCRIPTION OF THE DRAWINGS

The above and other aspects, features and advantages of the present invention will be more apparent from the following more particular description thereof, presented in conjunction with the following drawings wherein:

FIG. 1 is a partial top plan view of a semiconductor package made in accordance with the present invention;

FIG. 2 is a sectional view taken along the line 2—2 of FIG. 1;

FIG. 3 is a sectional view as in FIG. 2 wherein the anodization oxide layer of the heatspreader within the recess where the semiconductor die is mounted is removed to enhance thermal conduction between the die and the heatspreader; and FIG. 4 is a sectional profile view of an alternate type of semiconductor package made in accordance with the invention.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Many of the features and elements associated with modern semiconductor integrated circuit (IC) packages, and the manner of making semiconductor IC packages, are described in applicants' earlier patents, or other patents, as shown, e.g., in U.S. Pat. Nos. 4,092,697; 4,868,349; 4,878,108; 4,887,147; 5,147,821; 5,197,183; 5,262,927; 5,289,337; 5,353,193; 5,386,144; 5,527,743; 5,552,635; 5,557,150; 5,578,525; 5,583,377 and 5,650,662; all of which patents are incorporated herein by reference. Additional detailed information relative to semiconductor packages may be found in numerous other non-patent references, such as Lau, John H. (editor), *Ball Grid Array Technology* (McGraw-Hill, Inc. 1995); and Van Zant, P., *Microchip Fabrication, 3rd Edition,* Chapter 18 "Packaging" (McGraw-Hill 1997), also incorporated herein by reference.

The above-listed patents and references collectively describe most of the features and elements typically used in many of today's modern IC packages, including the various types of input/output (I/O) means that may be formed within a package substrate in order to make electrical connection to the semiconductor die housed within such IC package. The description of the present invention which follows does not repeat the features and elements shown in the cited patents and other literature, but instead focuses on those aspects of the present invention that are new and different from that which has heretofore been practiced in the semiconductor IC packaging art. It should be emphasized, however, that the features or elements disclosed in the referenced patents and other literature may be used within semiconductor packages which incorporate the present invention.

Turning first to FIGS. 1 and 2, there is shown a partial top and sectional view, respectively, of a semiconductor package 100 made in accordance with the invention. The package 100 includes a semiconductor die 102 having an active surface 103 (upper surface as oriented in FIG. 2) and a non-active surface 105 (lower surface as oriented in FIG. 2). The active surface 103 includes a plurality of contact pads 104 thereon through which electrical contact is made with the electronic circuits that are embedded within the die 102. Typically, these contact pads 104 are located along the edges of the die 102. At least one of the contact pads comprises a voltage potential pad 106. The voltage potential pad is electrically connected to a selected voltage source, e.g., Vdd, Vss, or ground, associated with the power source applied to the semiconductor die 102 in order to power the circuits embedded therein.

The non-active surface 105 of the die 102 is thermally bonded to a heatspreader 130, typically through a layer 112 of a suitable thermal conductive paste, such as Ablebond 965, available from numerous commercial sources. The heatspreader 130, in turn, is bonded to a package substrate 114, typically using a layer 128 of contact cement, such as chomerics PSA, also commercially available.

The package substrate 114 includes conventional input/output (I/O) means for making electrical connection with the pins, balls, legs or leads (not shown) of the semiconductor package, depending upon the type of semiconductor package that is employed. For the embodiment shown in FIGS. 1 and 2, such I/O means include a plurality of traces 118, or other conductive members, that connect each pin, ball, leg or lead of the package to a respective connection pad 116.

As seen best in FIG. 2, the die 102 is typically mounted within a recess 110 of the heatspreader 130. Such recess 110 is not required, but facilitates making the semiconductor package 100 thinner than it otherwise could be.

Bonding wires 120 connect each contact pad 104 of the IC die 102 to respective connection pads 116 of the package substrate 114. Such bonding wires 120 are typically connected to the contact pads 104 of the die using spot welds 123, and connected to the connection pads 116 of the package substrate 114 using spot welds 121, as is known in the art. Such connection thus allows each pin, ball, leg or lead of the package 100 to be electrically connected with a corresponding contact pad 104 of the semiconductor die 102. For a Tape Automated Bonding (TAB) type of semiconductor package, such connection may be achieved using beams, rather than bonding wires, as is also known in the art.

In accordance with the present invention, the heatspreader 130 is made from aluminum, or an alloy of aluminum, which has been anodized to form an oxide layer 132 thereon. The manner of anodizing aluminum is known in the art. Such anodization is typically realized through an anodic process performed in a suitable electrolyte with the aluminum as the anode. Anodization of aluminum is typically carried out using an electrolyte such as chromic acid or sulfuric acid, but other electrolytes may also be used.

Advantageously, the layer of aluminum oxide 132 that results from anodization process is typically a different color than is pure aluminum, thereby facilitating visual confirmation of the formation of the oxide layer 132. Moreover, for cosmetic or other purposes, the color of the anodization oxide layer may be selected to be a desired color, e.g., black, gray, or blue. Such layer 132 advantageously provides a protective and insulative coating for the aluminum. This protective and insulative coating further allows the heatspreader to be electrically connected to ground, or other voltage potential, e.g., +5 volts, without fear or concern that the heatspreader might inadvertently short to another voltage or signal. Such connection, in turn, allows the heatspreader 130 to function as a voltage plane in order to improve the electrical performance characteristics of the semiconductor package.

For the heatspreader 130 to function as a voltage plane, it must be bondable. That is, there must be a way to readily make electrical connection therewith. To facilitate such electrical connection, selected portions or areas of the oxide layer 132 are etched or milled away to expose small contact areas 124 of the aluminum heatspreader 130. Bonding wires 122, or equivalent, then connect at least one of the voltage potential pads 106 of the die 102 to the contact area 124 of the heatspreader 130. Conventional spot welds 123 and 125, or equivalent, may be used to secure the connection of the bonding wire 122 to the respective contact pads or areas.

A variation of the semiconductor package 100 shown in FIGS. 1 and 2 is illustrated as package 100' in FIG. 3. In all respects, the package 100' shown in FIG. 3 is the same as that shown in FIGS. 1 and 2 except that the oxide layer 132 in the area of the recess 100 has been removed. Removal of the oxide layer 132 in the area where the non-active surface of the die 102 contacts the heatspreader through the thermally-conductive layer 112 may improve the thermal conduction properties of the package. That is, while the oxide layer 132 is not a bad thermal conductor, a direct thermal path from the die 102 to the heatspreader 130 without having to pass through the oxide layer 132 offers a somewhat improved thermal path (better thermal conductivity, or less thermal resistance) than does a thermal path that includes the oxide layer 132.

The semiconductor package 100, or the package 100', is made using processes and techniques known in the art. The only difference is that the heatspreader is made from aluminum, instead of, e.g., copper. Once the aluminum heatspreader is formed it is anodized. Anodization places a protective film or layer 132 on the surface of the heatspreader. The thickness of the anodized layer 132 may be controlled to a certain extent during the anodization process, as is known in the art. After anodization, selected portions or areas 124 of the anodized heatspreader surface are removed, e.g., by grinding or milling away the oxide film or layer 132, to thereby expose the base aluminum heatspreader 132.

For the package 100' shown in FIG. 3, the entire recess 100, wherein the die 102 is mounted, may be milled (or otherwise formed) in the heatspreader 30 after anodization has taken place. That is, a single, solid piece of aluminum, e.g., an aluminum sheet having a thickness of between about 0.25 and 2.50 mm, may be formed in the size and shape desired for the heatspreader of the package type that is to be made. Then such piece of aluminum may be anodized to form the oxide film or layer 132 thereon. The recess 110 may then be formed in the heatspreader, e.g., to a depth of about 0.50 mm, which forming removes the oxide layer 132 in the area where the recess is formed. The die 102 is then thermally and mechanically bonded to the heatspreader 130 using a thermally conductive layer of cement, or bonding compound, 112. Wire bonds 120 are then made, in conventional manner, in order to connect the contact pads 104 of the die 102 to the connection pads 116 of the package substrate 114. Additional wire bonds 122 are also installed in order to connect the voltage potential contact pads 106 of the die 102 to the exposed areas 124 of the heatspreader 130. A suitable filler compound (not shown), e.g., epoxy, may then be used to cover the delicate wire bonds and to fill in the edges of the recess 110, as is commonly practiced in the art.

A flip-chip embodiment of the invention is illustrated in the partial sectional view of FIG. 4, which shows a flip chip semiconductor package 200. The flip chip includes a die 102' having an active surface 103' that has a plurality of solder bumps 107 thereon. The solder bumps 107 interface with suitable I/O means included within the substrate, as is known in the art, to electrically connect each solder bump 107 to a respective solder ball 109 located on a bottom surface of the package substrate 114'. I/O connection with the die 102' is thus made through the array of solder balls 109 located on the bottom surface of the substrate 114'.

Still referring to FIG. 4, the flip-chip package 200 includes a heatspreader 130' having a lower surface that is in thermal contact with a non-active surface 105' of the die 102'. Such thermal contact is typically made using a thermal compound or thermal bonding agent 112. Around the periphery of the die 102', the edges of the heatspreader 130' are secured to the upper surface of the package substrate 114 using a stiffener 140. The stiffener 140 may be a separate element to which the heatspreader 130' is attached, e.g., with fasteners or a suitable bonding cement; or the stiffener 140 may form an integral part of the heatspreader 130'. The heatspreader 130' is anodized to form a protective oxide film or layer 132 thereon. While FIG. 4 shows the protective layer 132 as being on both sides of the heatspreader 130', it is to be understood that it is also possible, and perhaps even preferable, to remove the oxide layer 132 on the underneath side of the heatspreader 130' in that region where the die 102' makes thermal contact therewith.

The bottom edge 142 of the heatspreader 130' (or the bottom edge of the stiffener 140, if used) is attached to the upper surface of the package substrate 114' using any suitable fastening or attaching technique, e.g., using a conductive bonding cement or epoxy 144. The oxide layer 132 is removed from such bottom edge 142 to facilitate making electrical connection with the heatspreader. A contact trace or contact pads, connected to suitable voltage potential solder bumps on the active surface 103' of the die 102', are included within the package substrate 114' so as to align with the bottom edge 142 of the heatspreader. Thus, when the heatspreader 130' is mounted on the package substrate 114', such contact trace or contact pads make electrical connection with the bottom edge 142, thereby electrically connecting the heatspreader 130' to a selected voltage potential bump of the die 102'. In this way, the heatspreader 130' may also function as a voltage plane within the semiconductor package 200, thereby enhancing the electrical performance of the package.

Using an anodized aluminum heatspreader within a semiconductor package in accordance with the present invention offers several advantages. First, aluminum is lighter than the equivalent copper heatspreader. Thus, the overall weight of the semiconductor package is less than has heretofore been achievable. Second, the aluminum heatspreader does not require nickel or gold plating, as is common (and required)

with copper heatspreaders. Hence, the overall or total cost of the components used within the semiconductor package is reduced. Third, being able to laminate the substrate package to the aluminum heatspreader using, e.g., an epoxy, advantageously provides a stronger bond than has heretofore been achievable when bonding to a gold- or nickel-plated copper heatspreader. Therefore, the reliability of the semiconductor package is improved. Fourth, the ability to wirebond directly to the heatspreader allows the heatspreader to be used as a power or ground plane. The ability to incorporate power or ground planes within the semiconductor package significantly improves the electrical performance of the semiconductor package.

Thus, it is seen that by using an anodized aluminum heatspreader within a semiconductor package in accordance with the present invention a semiconductor package is provided that is lighter, less expensive, more reliable, and provides improved electrical performance, than has heretofore been achievable using a plated copper heatspreader as is common in the prior art.

It should also be noted that the anodized aluminum heatspreader of the present invention provides the opportunity to give the semiconductor package a desired color, e.g., black, which not only can improve heat dissipation of the package, but may also enhance the cosmetic appearance of the package. Moreover, because the oxide layer of the anodized aluminum heatspreader is a good electrical insulator, the resulting semiconductor package offers the advantage of a robust metal exterior surface which is electrically insulated. Thus, inadvertent electrical contact with the exterior of the package will not cause any problems.

Finally, it is noted that the semiconductor package of the present invention, with its anodized aluminum heatspreader, provides a similar exterior surface for attaching external heatsinks. Because such external heatsinks are typically made from aluminum, a good mechanical and thermal interface between the package and external heatsink results.

While the invention herein disclosed has been described by means of specific embodiments and applications thereof, numerous modifications and variations could be made thereto by those skilled in the art without departing from the scope of the invention set forth in the claims.

What is claimed is:

1. A semiconductor package comprising:
   a semiconductor die electrically connected to a substrate; and
   an anodized aluminum heatspreader having a first side an a second side, said first side including a recessed portion, said semiconductor die being thermally bonded to the recessed portion of said heatspreader;
   wherein the anodized aluminum heatspreader includes and aluminum heatspreader that has been anodized to form an aluminum oxide coating thereon, and wherein the anodized aluminum heatspreader includes at least one attachment area where said aluminum oxide coating is removed and to which one end of a bonding wire is directly bonded such that the wire is in physical contact with the aluminum heatspreader, where the other end of the bonding wire is bonded to the semiconductor die.

2. The semiconductor package of claim 1 wherein said semiconductor die includes a plurality of attachment pads on an active surface thereof, and wherein said semiconductor package further includes means for electrically connecting at least one of said plurality of attachment pads of the semiconductor die to the attachment area of the anodized aluminum heatspreader.

3. The semiconductor package of claim 2 wherein said anodized aluminum heatspreader is electrically connected to a voltage potential, whereby the heatspreader serves as a voltage plane within the semiconductor package.

4. The semiconductor package of claim 3 wherein said anodized aluminum heatspreader is electrically connected to a ground zero voltage potential.

5. The semiconductor package of claim 3 wherein said anodized aluminum heatspreader is electrically connected to a non-ground voltage potential.

6. The semiconductor package of claim 1 wherein the at least one attachment area of the anodized aluminum heatspreader comprises an area on the first side of the anodized aluminum heatspreader.

7. The semiconductor package of claim 1 wherein the aluminum oxide coating is at least partially removed within the recess such that at least one thermal path exists between the non-active surface of the semiconductor die and the heatspreader that does not pass through the aluminum oxide coating.

8. The semiconductor package of claim 7 wherein said semiconductor package is selected from the group consisting of PBGA (plastic ball grid array), TBGA (tape ball grid array), PPGA (plastic pin grid array), and PQFP (plastic quad flat pack) packages.

9. The semiconductor package of claim 1 wherein the recessed portion of said first side comprises an area where the aluminum oxide coating has been removed.

10. A semiconductor package comprising:
    a semiconductor die having an active surface and an inactive surface, said active surface having at least one electrical contact pad formed thereon; and
    a bondable aluminum heatspreader comprising a piece of aluminum that has been anodized to form a protective, insulative, aluminum oxide coating thereon, said heatspreader including a surface area wherein said aluminum oxide coating is removed to enable placement of said semiconductor die, and said heatspreader including at least one contact area wherein said aluminum oxide coating is removed to enable electrical connection thereto; and
    said semiconductor die being thermally bonded to said heatspreader in said surface area wherein said aluminum oxide coating is removed, and said at least one contact pad on said active surface of said semiconductor die being electrically connected to the heatspreader by a bonding wire that is directly bonded to the at least one contact area wherein said aluminum oxide coating is removed, such that the wire is in physical contact with the aluminum heatspreader.

11. The package of claim 10 further including electrical connection means for electrically connecting said at least one contact area on the surface of said heatspreader with said at least one contact pad on said active surface of the semiconductor die.

12. The package of claim 11 wherein said heatspreader is electrically connected to a voltage potential creating a voltage plane within the semiconductor package.

13. The package of claim 12 wherein said heatspreader is electrically connected to a ground voltage potential.

14. The package of claim 12 wherein said heatspreader is electrically connected to a non-ground voltage potential.

15. The package of claim 10 wherein a recess is formed within the bondable aluminum heatspreader in which the semiconductor die is placed.

* * * * *